United States Patent [19]

Kashida et al.

[11] Patent Number: 5,326,649
[45] Date of Patent: Jul. 5, 1994

[54] X-RAY TRANSMITTING MEMBRANE FOR MASK IN X-RAY LITHOGRAPHY AND METHOD FOR PREPARING THE SAME

[75] Inventors: Meguru Kashida; Yoshihiko Nagata; Hitoshi Noguchi, all of Gunma, Japan

[73] Assignee: Shin-Etsu Chemical Co., Ltd., Tokyo, Japan

[21] Appl. No.: 857,838

[22] Filed: Mar. 26, 1992

[30] Foreign Application Priority Data

Mar. 27, 1991 [JP] Japan .................................. 3-087625

[51] Int. Cl.$^5$ ............................ B32B 9/00; G03F 9/00
[52] U.S. Cl. ...................................... 428/698; 428/45; 428/157; 428/446; 428/704; 430/5; 427/160; 427/250; 427/255.1; 427/372.2; 378/35
[58] Field of Search ............... 428/156, 157, 172, 446, 428/45, 81, 704, 698, 192; 430/5, 966; 427/387, 372.2, 383.1, 160, 250, 255.1; 378/154, 156, 34, 35

[56] References Cited

U.S. PATENT DOCUMENTS 5,066,533 11/1991 America et al. .................... 428/156

*Primary Examiner*—Donald J. Loney
*Attorney, Agent, or Firm*—McAulay Fisher Nissen Goldberg & Kiel

[57] ABSTRACT

Disclosed is an X-ray transmitting frame-supported membrane of silicon nitride suitable as a mask blank of an X-ray lithographic mask having outstandingly high resistance against irradiation with high-energy radiations and high transmission of light of a wavelength of 633 nm. These very desirable properties are obtained as a consequence of the extremely low content, i.e. 1.0 atomic % or less, of hydrogen in the silicon nitride, which can be achieved as a result of the specific preparation procedure by the CVD method in which the reactant gases are silane or disilane and ammonia in a specified mixing ratio to be reacted under a specified pressure and at a specified temperature.

4 Claims, No Drawings

X-RAY TRANSMITTING MEMBRANE FOR MASK IN X-RAY LITHOGRAPHY AND METHOD FOR PREPARING THE SAME

BACKGROUND OF THE INVENTION

The present invention relates to an X-ray transmitting membrane for a mask used in X-ray lithography or, more particularly, to an X-ray transmitting membrane having excellent transmissivity to visible light, resistance against irradiation with high energy radiations and resistance against chemicals and moisture as well as smoothness of the surface and free from pinholes and other defects so as to be useful as a mask in the X-ray lithography and a method for the preparation thereof.

Along with the remarkable trend in recent years toward finer and finer patterning on semiconductor silicon wafers in the manufacture of various kinds of semiconductor devices such as LSIs, VLSIs and the like, the conventional photolithographic patterning method by using ultraviolet light is under continuous replacement with the so-called X-ray lithography in which the resist layer on a semiconductor silicon wafer is irradiated pattern-wise with X-rays through a so-called X-ray mask bearing a desired pattern impermeable to X-rays as formed on an X-ray transmitting membrane.

The X-ray transmitting membrane for an X-ray lithographic mask should satisfy several requirements including that:

(1) the membrane is made from a material which is stable and resistant even against a large dose of irradiation with high-energy beams such as X-rays as well as high-energy electron beams and synchrotron radiations;

(2) the membrane should be highly transparent with at least 50% transmission of visible light so as to enable exact alignment of the X-ray mask on the silicon wafer with high precision even when the membrane has a thickness large enough to ensure good mechanical strengths;

(3) the membrane should be chemically stable and resistant against chemicals and moisture so as not to be damaged or attacked in the process involving etching, washing and the like sometimes using strong chemicals; and (4) the membrane should have a smooth surface and be free from pinholes and other defects.

Several materials have been proposed in the prior art as a material of membranes for X-ray lithographic masks including boron nitride BN, silicon nitride $Si_3N_4$, silicon carbide SiC and the like but none of them can satisfy all of the above mentioned requirements altogether since each of them has its own merits and demerits. For example, these prior art membranes are insufficient in the resistance against high-energy beam irradiation as the most important property which the membrane should have. The reason for their poor stability against radiations is presumably as follows. While these membrane are formed by the so-called chemical vapor-phase deposition (CVD) method or, in particular, by the plasma CVD method, namely, the membrane formed by the CVD method usually contains a large amount of hydrogen atoms sometime reaching 10 to 20 atomic % or even larger and these hydrogen atoms are suspected to be responsible for the instability of the membrane under irradiation with high-energy beams.

For example, X-ray transmitting membranes of silicon nitride are prepared by the CVD method using trichlorosilane and ammonia as the reactant gases under reduced pressure of 0.1 to 1 Torr at a temperature of 700° to 900° C. The silicon nitride membranes prepared by the above mentioned CVD method were considered in the prior art to be substantially free from hydrogen atoms because no absorption bands assignable to the bonds of Si-H, N-H and the like could be found in the infrared absorption spectrum obtained by the FT-IR method and the like. Despite the seeming absence of hydrogen atoms, the silicon nitride membranes in the prior art are subject to deformation when they are used as an X-ray lithographic mask and irradiated with high-energy beams. It is a presumable reason therefor that, although the membrane is free from hydrogen at least by the infrared absorption spectrophotometric analysis, a considerable amount of hydrogen, which can be detected by a more sensitive analytical method, is contained in the membrane to play an adverse role under irradiation with highenergy radiations. It is also presumable that such a large content of hydrogen in conventional silicon nitride membranes is caused as a result of the plasma CVD method which is conducted usually at a relatively low temperature of up to 800° C. In fact, a silicon nitride membrane was prepared by the CVD method at 800° C. or below from trichlorosilane and ammonia as the reactants and the hydrogen content in the membrane was measured by the RBS-HFS method to detect 2.0 to 5.0 atomic % of hydrogen therein although no absorption band assignable to hydrogen could be noted in the infrared absorption spectrum.

SUMMARY OF THE INVENTION

The present invention accordingly has an object to provide an improved X-ray transmitting membrane of silicon nitride which is useful in the preparation of an X-ray lithographic mask satisfying all of the above mentioned requirements or, in particular, the requirement for the stability of the membrane under irradiation with high-energy radiations.

Thus, the X-ray transmitting membrane of the invention is a frame-supported membrane of silicon nitride formed by the chemical vapor-phase deposition method from a silicon-containing compound such as silane $SiH_4$ and disilane $Si_2H_6$ and a nitrogen-containing compound such as ammonia as the reactant gases, of which the transmission of the light of 633 nm wavelength is at least 70% when the membrane has a thickness of 0.1 to 10 μm and a content of hydrogen does not exceed 1.0 atomic %.

The membrane of silicon nitride defined above can be prepared by the method in which silicon nitride is deposited on the surface of a silicon wafer as the substrate by the CVD method using a nitrogen-containing compound and a silicon-containing compound in a molar ratio N:Si in the range from 0.5 to 100 under a pressure in the range from 0.01 to 5 Torr at a temperature in the range from 900° to 1500° C. or, preferably, from 950° to 1500° C. followed by partial removal of the substrate from the silicon nitride film deposited thereon leaving the peripheral portion of the substrate to serve as a frame.

DETAILED DESCRIPTION OF THE PREFERRED EMBODIMENTS

As is described above, the most characteristic feature of the inventive X-ray transmitting membrane of silicon nitride consists in the extremely low content of hydrogen atoms not exceeding 1.0 atomic % and such a silicon nitride membrane of low hydrogen content can be obtained only by the CVD method carried out under the above described very specific conditions. Although no hydrogen could be detected by the FT-IR method in a silicon nitride membranes prepared by the CVD method under conventional conditions using dichlorosilane and ammonia as the reactant gases at a temperature of 800° C., the undetectability of hydrogen by the FT-IR method never means absence of hydrogen and the above mentioned silicon nitride membrane usually contains about 2 to 5 atomic % of hydrogen according to the analytical result by the RBS-HFS (Rutherford back-scattering spectrometric-hydrogen forward scattering analysis) method indicating insufficient sensitivity of the FT-IR method for the analysis of hydrogen in a very low content.

In contrast thereto, the silicon nitride membrane prepared according to the inventive method usually contains only about 0.8 atomic % or less of hydrogen according to the analytical result by the RBS-HFS method. It has been unexpectedly discovered that the silicon nitride membranes can be imparted with very high resistance against irradiation with high-energy radiations along with a high transmissivity of 70% or even larger to the visible light of 633 nm wavelength only when the content of hydrogen in the membrane having a thickness of 10 μm does not exceed 1.0 atomic %.

The X-ray transmitting membrane of the invention is a frame-supported membrane of silicon nitride expressed by a nonstoichiometric chemical formula of $SiN_x$, in which x is a positive number of 0.5 to 1.5. This silicon nitride membrane can be prepared by the CVD method using a silicon-containing compound and a nitrogen-containing compound each in the gaseous form as the reactant gases. The reactant gases are not particularly limitative provided that they can be obtained in the form of a gas or vapor so that various kinds of liquid compounds vaporizable by heating, pressure-reduction or bubbling of hydrogen gas or an inert gas therethrough can be used for the purpose. Preferably, the silicon-containing compound is silane $SiH_4$, disilane $Si_2H_6$ or a mixture thereof and the nitrogen-containing compound is ammonia. A compound containing both of silicon and nitrogen in a molecule, such as silazane compounds, can be used alone as the reactant gas in the CVD process provided that the compound satisfies the above mentioned requirement.

The material of the substrate plate, on which silicon nitride formed by the CVD method is deposited to give a film supported by the substrate, is not particularly limitative provided that the substrate plate has a smooth surface and is free from melting or softening even at the temperature at which the CVD process is undertaken or, namely, at 900° C. or higher or, desirably, 950° C. or higher. Further, the material of the substrate must be susceptible to the partial removal from the deposited silicon nitride film leaving the fram-like peripheral portions by some means such as chemical etching. High-purity silicon wafers and fused quartz glass plates can be used satisfactorily as the substrate plate on which silicon nitride is deposited.

Preparation of the inventive silicon nitride membrane by the CVD method must be performed under specific conditions including the ranges of the mixing proportion of the silicon-containing compound and the nitrogen-containing compound, temperature and pressure.

For example, the mixing ratio of the silicon-containing compound and the nitrogen-containing compound in the gaseous mixture is in such a range that the molar ratio of nitrogen to silicon, i.e. N:SI, is in the range from 0.5 to 100 or, preferably, in the range from 0.5 to 10. When this molar ratio is too small, the silicon nitride membrane would contain silicon in an excessively large amount so that the membrane would have a less smooth surface. When the molar ratio is too large, on the other hand, an undue increase is caused in the content of the nitrogen-containing compound in the gaseous atmosphere resulting in various disadvantages.

The reaction temperature of the CVD process, which is naturally required not to exceed the melting point of the substrate material on which silicon nitride is deposited to form a film, should be in the range from 900° to 1500° C. or, preferably, from 950° to 1500° C. When the temperature is too low, the silicon nitride membrane formed thereby would contain an increased amount of hydrogen to affect the stability of the membrane under high-energy irradiation. When the temperature is too high, on the other hand, crystallization of silicon nitride is promoted in the membrane so as to cause a decrease in the smoothness of the membrane surface and transparency thereof to visible light in addition to an increased possibility of impurities entering the membrane. The pressure of the gaseous mixture in the CVD process is preferably in the range from 0.01 to 5.0 Torr. When the pressure is too low, an unduly long time is taken for the deposition of the silicon nitride film having a desired thickness because of the limited feed rates of the reactant materials. When the pressure is too high, on the other hand, the silicon nitride film deposited on the substrate surface would have an increased internal stress so that difficulties are caused in the preparation of a frame-supported membrane by removing the substrate bearing the silicon nitride film leaving the frame portion. When the CVD process is performed under the above described conditions, the film of silicon nitride deposited on the substrate would have an internal tensile stress in the range from $1 \times 10^9$ to $4 \times 10^9$ dyn/cm2 so as to facilitate preparation of a frame-supported membrane.

The furnace in which the CVD process is performed is not particularly limitative and can be any of conventional furnaces suitable for the CVD method including normal-pressure or reduced-pressure CVD furnaces, epitaxial furnaces, cold-wall furnaces and the like but hot-wall CVD furnaces suitable for evacuation are preferred.

The X-ray transmitting membrane of the invention for X-ray lithographic mask has a thickness in the range from 0.1 to 10 μm or, usually, from 0.5 to 5 μm. The silicon nitride membrane prepared by the above described CVD method contains only 1.0 atomic % or less of hydrogen which can be determined only by a high-sensitivity analytical method such as the RBS-HFS method. This low hydrogen content in the silicon nitride membrane is essential in order that the membrane is highly resistant against irradiation with high-energy radiations to exhibit smaller than 1% decrement in the internal stress when the membrane is irradiated with high-energy electron beams of 10 keV energy in a dose of 500 MJ/cm$^3$. Further, transmission of visible light having a wavelength of 633 nm through the inventive silicon nitride membrane is at least 70% even when the membrane has a thickness large enough to ensure good mechanical strengths enabling high-precision alignment of the X-ray lithographic mask.

In the following, examples are given to illustrate the silicon nitride membrane of the present invention as well as the method for the preparation thereof.

EXAMPLE

The CVD furnace of the hot-wall type used had a reaction chamber which was a tube of fused quartz glass having an inner diameter of 150 mm and a length of 2200 mm and could be heated externally by means of a heater coil wound therearound. A semiconductor silicon wafer having a diameter of 76 mm and a thickness of 0.6 mm as the substrate plate was set in the uniform-temperature zone of the reaction chamber by using a carbon-made holder and then the chamber was evacuated down to a pressure of 0.05 Torr while the temperature of the furnace was increased up to 1000° C. taking 1 hour.

Thereafter, a gaseous mixture obtained by mixing a first mixture of 10% by volume of silane and 90% by volume of hydrogen at a flow rate of 77 ml/minute and a second mixture of 10% by volume of ammonia and 90% by volume of hydrogen at a flow rate of 200 ml/minute was continuously introduced into the reaction chamber so as to keep the pressure inside the chamber at 0.5 Torr by the balance with continuous evacuation to effect deposition of silicon nitride on to the surface of the substrate plate for 3 hours.

After the end of the 3 hours reaction period, the furnace was cooled to room temperature and the pressure inside the chamber was increased to normal pressure by introducing nitrogen gas thereinto. The sample taken out of the chamber was examined for the thickness of the silicon nitride film deposited on the substrate surface to find an average film thickness of 1.0 $\mu$m with a variation 3 $\sigma = 0.05$ $\mu$m for 16 points of measurement. The internal tensile stress of the silicon nitride film formed on the substrate was $1 \times 10^9$ dyn/cm$^2$ as calculated from the value of warping of the silicon wafer as the substrate. The content of hydrogen in the silicon nitride film was 0.8 atomic % according to the analytical result by the RBS-HFS method.

In the next place, a film of boron nitride having a thickness of 0.5 $\mu$m was formed by the plasma CVD method on the surface of the silicon wafer substrate opposite to the surface on which the silicon nitride film had been formed. Then, the surface of the boron nitride film was covered by mounting a circular stainless steel plate having a diameter of 76 mm and a thickness of 0.3 mm and provided with a circular opening of 25 mm diameter at the center and the boron nitride film in the thus exposed circular area of 25 mm diameter was removed by dry etching using a gaseous mixture of 96% by volume of carbon tetrafluoride and 4% by volume of oxygen. Thereafter, the silicon wafer in the area thus exposed by removing the boron nitride film was dissolved away by wet etching in a 20% by weight aqueous solution of potassium hydroxide heated at 90° C. to leave the silicon nitride film in the form of a frame-supported membrane which could be used as a mask blank for an X-ray lithographic mask.

The thus obtained frame-supported membrane of silicon nitride was examined for the transmissivity of visible light to find that the transmission of the light of 633 nm wavelength therethrough was 85%. Further, the silicon nitride membrane was subjected to the test of resistance against high-energy radiations by irradiating with electron beams of 16 keV energy in a dose of 500 MJ/cm$^3$ to find that the change caused in the internal stress of the membrane was smaller than 1% so that it could be concluded that the membrane was highly resistant and stable against irradiation with high-energy radiations.

What is claimed is:

1. An X-ray transmitting frame-supported membrane of silicon nitride having a thickness in the range from 0.1 to 10 $\mu$m formed by the method of chemical vapor-phase deposition from a silicon-containing compound and a nitrogen-containing compound as the reactant gases, of which the content of hydrogen does not exceed 1.0 atomic % and transmission of light having a wavelength of 633 nm therethrough is at least 70%.

2. A method for the preparation of an X-ray transmitting frame-supported membrane of silicon nitride according to claim 1 which comprises the steps of: depositing, on a silicon wafer as a substrate, a film of silicon nitride formed by the reaction of a silicon-containing compound and a nitrogen-containing compound mixed in such a molar ratio that the ratio of nitrogen to silicon is in the range from 0.5 to 100 in the gaseous phase under a pressure in the range from 0.01 to 5 Torr at a temperature in the range from 900° to 1500° C.; and partially removing the silicon wafer substrate from the deposited silicon nitride film leaving the portion to serve as a frame.

3. The method for the preparation of an X-ray transmitting frame-supported membrane of silicon nitride as claimed in claim 2 in which the silicon-containing compound is silane SiH$_4$ or disilane Si$_2$H$_6$ and the nitrogen-containing compound is ammonia.

4. The method for the preparation of an X-ray transmitting frame-supported membrane of silicon nitride as claimed in claim 2 in which the temperature in the step of deposition of silicon nitride is in the range from 950° to 1500° C.

* * * * *